US012592356B2

(12) United States Patent
Ogura

(10) Patent No.: US 12,592,356 B2
(45) Date of Patent: Mar. 31, 2026

(54) SAMPLE HOLDER AND IMPEDANCE MICROSCOPE

(71) Applicant: National Institute of Advanced Industrial Science and Technology, Tokyo (JP)

(72) Inventor: Toshihiko Ogura, Tsukuba (JP)

( * ) Notice: Subject to any disclaimer, the term of this patent is extended or adjusted under 35 U.S.C. 154(b) by 373 days.

(21) Appl. No.: 18/562,345

(22) PCT Filed: May 24, 2022

(86) PCT No.: PCT/JP2022/021239
§ 371 (c)(1),
(2) Date: Nov. 20, 2023

(87) PCT Pub. No.: WO2022/250049
PCT Pub. Date: Dec. 1, 2022

(65) Prior Publication Data
US 2024/0242927 A1 Jul. 18, 2024

(30) Foreign Application Priority Data
May 25, 2021 (JP) ................................. 2021-087424

(51) Int. Cl.
*H01J 37/20* (2006.01)
*H01J 37/09* (2006.01)
(Continued)

(52) U.S. Cl.
CPC .............. *H01J 37/20* (2013.01); *H01J 37/09* (2013.01); *H01J 37/28* (2013.01); *H01J 37/24* (2013.01)

(58) Field of Classification Search
CPC .. H01J 37/00; H01J 37/02; H01J 37/20; H01J 37/09; H01J 37/26; H01J 37/24; H01J 37/28; G01N 23/2251
(Continued)

(56) References Cited

U.S. PATENT DOCUMENTS

2010/0218286 A1 8/2010 Lai et al.
2014/0346352 A1 11/2014 Ogura
(Continued)

FOREIGN PATENT DOCUMENTS

JP 2002-055038 2/2002
JP 2013-134952 7/2013
(Continued)

OTHER PUBLICATIONS

International Search Report dated Aug. 2, 2022 for PCT/JP2022/021239.
(Continued)

*Primary Examiner* — Jason L McCormack
(74) *Attorney, Agent, or Firm* — SHIPWAY IP

(57) ABSTRACT

A sample holder for an impedance microscope according to an aspect includes: a first insulating film having a front surface and a back surface; a second insulating film having a front surface facing the back surface of the first insulating film and a back surface; a conductive film disposed on the front surface of the first insulating film; an electrode disposed to face the back surface of the second insulating film; and a conductive member fixed at a ground potential or a constant potential, in which the conductive member has an opening located between the first insulating film and the electrode.

11 Claims, 7 Drawing Sheets

(51) Int. Cl.
 *H01J 37/28* (2006.01)
 *H01J 37/24* (2006.01)
(58) Field of Classification Search
 USPC ............................ 250/306, 307, 311, 440.11
 See application file for complete search history.

(56) References Cited

U.S. PATENT DOCUMENTS

| | | | | |
|---|---|---|---|---|
| 2015/0214003 | A1 | 7/2015 | Ogura | |
| 2018/0284040 | A1* | 10/2018 | Ogura | H01J 37/20 |
| 2019/0049399 | A1* | 2/2019 | Ogura | G01N 33/48 |
| 2021/0270758 | A1 | 9/2021 | Ogura | |

FOREIGN PATENT DOCUMENTS

| | | |
|---|---|---|
| JP | 2014-022323 | 2/2014 |
| JP | 2019-508700 | 3/2019 |
| JP | 6652265 | 2/2020 |
| WO | 2017/065135 | 4/2017 |
| WO | 2017/184349 | 10/2017 |
| WO | 2019/104254 | 5/2019 |
| WO | 2019/244468 | 12/2019 |

OTHER PUBLICATIONS

W. Kuang, S.O. Nelson, "Low-frequency dielectric properties of biological tissues: a review with some new insights", Transactions of the ASAE, vol. 41(1), 1998, p. 173-p. 184.
Toshihiko Ogura, "Direct observation of unstained biological samples in water using newly developed impedance scanning electron microscopy", PLOS ONE, vol. 14(8), e0221296, 2019, p. 1-p. 17.
International Preliminary Report on Patentability with Written Opinion dated Dec. 7, 2023 for PCT/JP2022/021239.

* cited by examiner (a)

(b)

(a)

(b)

1

SAMPLE HOLDER AND IMPEDANCE MICROSCOPE

CROSS-REFERENCE TO RELATED APPLICATION

This application is a 35 U.S.C. § 371 national phase application of PCT/JP2022/021239, filed on May 24, 2022, which claims priority to Japanese Patent Application No. 2021-087424, filed on May 25, 2021.

TECHNICAL FIELD

The present disclosure relates to a sample holder and an impedance microscope.

BACKGROUND ART

As a device for observing a sample such as an organic substance, an optical microscope using visible light is widely used. The spatial resolution of the optical microscope is restricted to about 200 nm due to the diffraction limit of visible light. When higher spatial resolution is required, an electron microscope using an electron beam having a wavelength shorter than that of visible light is used. In a case of using the electron microscope, in order to reduce a damage of a sample by the electron beam, pretreatment is generally performed in which a front surface of the sample is coated with gold, platinum, or the like, or the sample is dyed with heavy metals. Even when these pretreatments are performed, many artifacts are mixed in an image obtained by the electron microscope, and it is not easy to obtain a high-contrast image. In addition, it is also difficult to perform composition analysis of the sample from the acquired image.

As a technique for obtaining a high-contrast image without performing the above-described pretreatments, a method described in Patent Literature 1 is known. Patent Literature 1 describes that an organic sample is disposed between a first insulating thin film and a second insulating thin film together with an aqueous solution, the conductive thin film formed on the first insulating thin film is scanned and irradiated with a pulsed electron beam whose intensity is changed in a pulsed manner, an image of the organic sample is generated based on a potential change on an outward surface of the second insulating thin film, and composition analysis of the organic sample is performed from a difference between images corresponding to the pulsed electron beam.

In addition, Non Patent Literature 1 describes an electrochemical impedance method for evaluating an electrical characteristic of a sample based on the impedance of the sample. As a technique using the electrochemical impedance method, impedance microscopes described in Patent Literature 2 and Non Patent Literature 2 are known. The impedance microscopes described in Patent Literature 2 and Non Patent Literature 2 include a sample holder that holds a sample. The sample holder includes a first insulating thin film, a second insulating thin film facing the first insulating thin film, a conductive thin film formed on the first insulating thin film, and an electrode facing the second insulating thin film. A sample is disposed between the first insulating thin film and the second insulating thin film of the sample holder together with an aqueous solution, an AC signal is applied to the electrode, and the conductive thin film is scanned and irradiated with an electron beam. Then, by analyzing the signal detected by the conductive thin film, an impedance characteristic of the sample is observed with micro- or nano-level resolution.

CITATION LIST

Patent Literature

Patent Literature 1: Japanese Patent No. 6652265
Patent Literature 2: International Publication WO 2019/244468

Non Patent Literature

Non Patent Literature 1: W Kuang, S O Nelson, "Low-frequency dielectric properties of biological tissues: a review with some new insights", Transactions of the ASAE, Vol. 41(1), pp 173-184, 1998
Non Patent Literature 2: Toshihiko Ogura, "Direct observation of unstained biological samples in water using newly developed impedance scanning electron microscopy", PLOS ONE, Vol. 14(8), e0221296(17 pp), 2019

SUMMARY OF INVENTION

Technical Problem

In the impedance microscopes described in Patent Literature 2 and Non Patent Literature 2, an electric field is formed between the electrode and the conductive thin film by the AC signal applied to the electrode, and the AC signal is propagated from the electrode to the conductive thin film along with the formation of the electric field. Here, in these impedance microscopes, the electric field formed between the electrode and the conductive thin film is formed to spread over an entire sample holder. Therefore, a propagation path of the AC signal between the electrode and the conductive thin film is formed not only in a region between the electrode and an observation window for observing the sample but also in a region between the electrode and a non-observation region that does not contribute to the observation of the sample. The signal component propagated through the non-observation region to the conductive thin film becomes a noise or an offset component, which causes a relative decrease in an intensity of the signal component propagated through the path between the electrode and the observation window. Therefore, in this type of impedance microscope, a noise component is included in the signal detected by the conductive thin film, and the contrast and spatial resolution of the image may be deteriorated.

Therefore, an object of the present disclosure is to provide a sample holder for an impedance microscope and an impedance microscope capable of reducing a noise component included in a detection signal.

Solution to Problem

A sample holder for an impedance microscope according to an aspect includes: a first insulating film having a front surface and a back surface; a second insulating film having a front surface facing the back surface of the first insulating film and a back surface; a conductive film disposed on the front surface of the first insulating film; an electrode disposed to face the back surface of the second insulating film; and a conductive member fixed at a ground potential or a constant potential, in which the conductive member has an opening located between the first insulating film and the electrode.

Since the conductive member coupled to the ground potential or the constant DC potential blocks an electric field by an electrostatic shielding action, in the sample holder of the present aspect, a region where the electric field is formed between the electrode and the conductive film is limited to a region where the opening is formed. Therefore, it is possible to suppress the spread of the electric field and to suppress the formation of a path of an AC signal between the electrode and a region that does not contribute to the observation. As a result, a noise component included in the signal detected by the conductive film can be reduced.

In one embodiment, the conductive member may be disposed to surround the periphery of the electrode. The conductive member may be disposed on the back surface of the second insulating film. The conductive member may be disposed between the first insulating film and the second insulating film.

The sample holder of one embodiment may further include a frame member disposed on the front surface of the first insulating film to define an observation window for observing a sample inside the frame member, and when an AC signal is applied to the electrode to form an electric field between the electrode and the conductive film, the conductive member may suppress spread of the electric field to outside of the observation window by an electrostatic shielding effect. The electrode may have an elongated shape extending toward the second insulating film, and the opening of the conductive member may be located between the observation window and a distal end portion of the electrode on the second insulating film side.

An impedance microscope according to one aspect includes: a first insulating film having a front surface and a back surface; a second insulating film having a front surface facing the back surface of the first insulating film and a back surface, the second insulating film forming a space in which a sample is disposed between the first insulating film and the second insulating film; a conductive film disposed on the front surface of the first insulating film; an electrode disposed to face the back surface of the second insulating film; a conductive member fixed at a ground potential or a constant potential; a beam irradiation unit that scans the conductive film while irradiating the conductive film with a beam; a power supply that applies an AC signal to the electrode; and an image generation unit that generates an image of the sample based on the AC signal guided to the conductive film when the AC signal is applied to the electrode while scanning the conductive film with the beam, in which the conductive member has an opening located between the first insulating film and the electrode.

According to the impedance microscope according to the present aspect, a noise component of a signal detected by the conductive film can be reduced. As a result, the contrast and the spatial resolution of the image can be improved.

The impedance microscope according to an embodiment may further include a frame member disposed on the front surface of the first insulating film to define an observation window for observing a sample inside the frame member, and when an AC signal is applied to the electrode to form an electric field between the electrode and the conductive film, the conductive member may suppress spread of the electric field to outside of the observation window by an electrostatic shielding effect. The electrode may have an elongated shape extending toward the second insulating film, and the opening of the conductive member may be located between the observation window and a distal end portion of the electrode on the second insulating film side.

A sample holder for an impedance microscope according to one aspect includes: an electrode coupled to a power supply; a first insulating film having a front surface and a back surface; a frame member disposed on the front surface of the first insulating film to define an observation window for observing a sample inside the frame member; a conductive film that is in contact with the front surface of the first insulating film inside the frame member; a second insulating film disposed between the electrode and the back surface of the first insulating film, the second insulating film forming a housing space in which the sample is disposed between the first insulating film and the second insulating film; and a conductive member that suppresses spread of an electric field to outside of the observation window by an electrostatic shielding effect when an AC signal is applied from the power supply to the electrode to form electric field between the electrode and the conductive film.

In the sample holder of the present aspect, since the electrostatic shielding effect of the conductive member can suppress the spread of the electric field to the outside of the observation window that does not contribute to the observation of the sample, the noise component included in the signal detected by the conductive film can be reduced.

In one embodiment, the electrode may have an elongated shape extending toward the second insulating film, and the conductive member may have an opening located between the observation window and the distal end portion of the electrode on the second insulating film side.

Advantageous Effects of Invention

According to one aspect and various embodiments of the present invention, a noise component included in a detection signal can be reduced.

DESCRIPTION OF EMBODIMENTS

Figure 1:
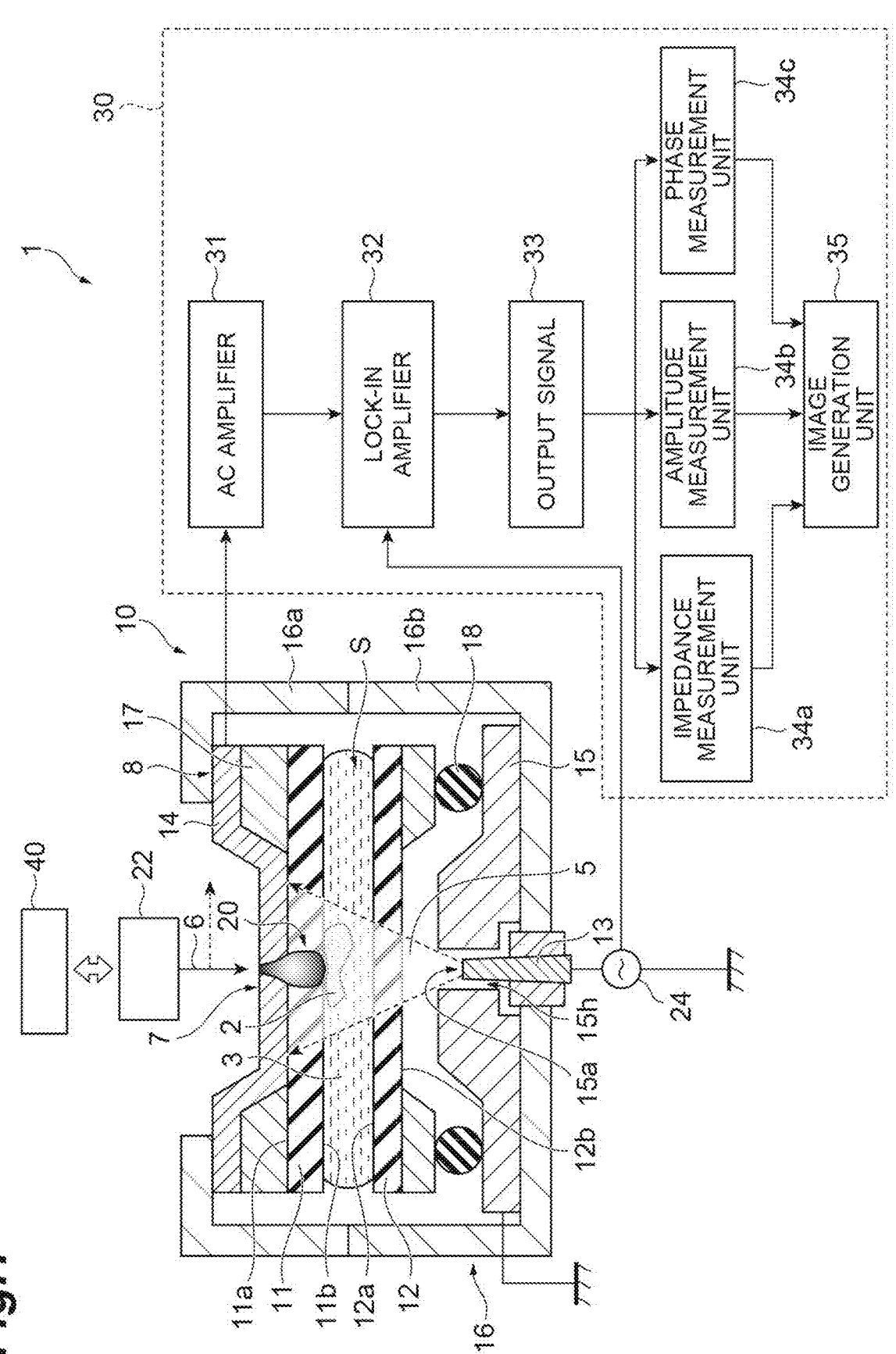
FIG. 1 is a cross-sectional view schematically illustrating an impedance microscope including a sample holder according to a first embodiment.

Hereinafter, embodiments of the present disclosure will be described with reference to the drawings. In the following description, the same or equivalent elements are denoted by the same reference numerals, and redundant description will not be repeated. The dimensional ratios in the drawings do not necessarily coincide with those in the description. In the following description, for convenience, a stacking direction of a first insulating film 11 and a conductive film 14 to be described later may be referred to as a "vertical direction".

First Embodiment

FIG. 1 is a cross-sectional view schematically illustrating an impedance microscope including a sample holder according to a first embodiment. An impedance microscope 1 illustrated in FIG. 1 is an observation device that generates an image (impedance image) of a sample based on impedance information. The impedance microscope 1 includes a sample holder 10 that is disposed on a stage of the impedance microscope 1 and holds a sample 2 as an observation target.

As illustrated in FIG. 1, the sample holder 10 includes a first insulating film 11, a second insulating film 12, an electrode 13, a conductive film 14, and a conductive member 15. The first insulating film 11, the second insulating film, the electrode 13, the conductive film 14, and the conductive member 15 are housed inside an outer frame body 16. In one embodiment, the outer frame body 16 may include an upper portion 16a and a lower portion 16b. For example, the upper portion 16a is made of a conductor such as aluminum, and the lower portion 16b is made of an insulator such as an acrylic resin. The upper portion 16a and the lower portion 16b may be integrally formed of the same material. An opening is formed in an upper portion of the outer frame body 16.

The first insulating film 11 is disposed so as to close an upper opening of the outer frame body 16. The first insulating film 11 has a front surface 11a and a back surface 11b. The front surface 11a of the first insulating film 11 faces the upper opening side of the outer frame body 16, and the back surface 11b of the first insulating film 11 is provided on the side opposite to the front surface 11a. The second insulating film 12 has a front surface 12a and a back surface 12b, and is disposed below the first insulating film 11. The front surface 12a of the second insulating film 12 is disposed to face the back surface 11b of the first insulating film 11, and the back surface 12b of the second insulating film 12 is provided on the side opposite to the front surface 12a. That is, the second insulating film 12 faces the first insulating film 11. The first insulating film 11 and the second insulating film 12 are made of a material having a high insulating property and a high withstand voltage, for example, silicon nitride (SiN).

A housing space S in which the sample 2 is disposed is formed between the back surface 11b of the first insulating film 11 and the front surface 12a of the second insulating film 12. In the housing space S, the sample 2 as an observation target is disposed together with an aqueous solution 3. The sample 2 may be, for example, an organic sample such as bacteria, virus, protein, and protein complex, or may be particles composed of ceramics, metal, or the like. In addition, the sample 2 may be liquid food such as milk and mayonnaise, cosmetics such as sunscreen and hand cream, or industrial lubricating oil such as machine oil and gear oil.

A frame member 17 having a rectangular frame shape is disposed on the first insulating film 11. The frame member 17 defines an observation window 7 for observing the sample 2 inside the frame member 17. The conductive film 14 is disposed on the front surface 11a of the first insulating film 11 via the frame member 17. The conductive film 14 is a thin film having conductivity, and is made of metal such as tungsten, for example. The conductive film 14 is formed on the front surface 11a of the first insulating film 11 by, for example, a sputtering method. As illustrated in FIG. 1, the conductive film 14 may be in contact with the front surface 11a of the first insulating film 11 in an inner region of the observation window 7, and the conductive film 14 may be separated from the front surface 11a of the first insulating film 11 via the frame member 17 in an outer region of the observation window 7.

The electrode 13 is disposed below the second insulating film 12. As illustrated in FIG. 1, the electrode 13 is an elongated conductive member, and is inserted into the outer frame body 16 such that a distal end portion thereof is disposed inside the outer frame body 16 and a proximal end portion thereof is disposed outside the outer frame body 16. Therefore, the electrode 13 extends toward the second insulating film 12, and the distal end portion thereof faces the back surface 12b of the second insulating film 12. The electrode 13 is fixed to a bottom portion of the outer frame body 16 via an insulating member. As described later, the electrode 13 receives an AC signal from a power supply 24, and generates an electric field 5 between the electrode 13 and the conductive film 14 in the sample holder 10.

The conductive member 15 is disposed below the second insulating film 12 and spaced apart from the second insulating film 12. That is, conductive member 15 is disposed on the bottom portion of outer frame body 16. The conductive member 15 has a substantially flat plate shape or a disk shape, and is made of a conductive material such as aluminum or copper. The conductive member 15 is electrically grounded and fixed at a ground potential. Note that the conductive member 15 may be coupled to a DC voltage and fixed at a constant potential. The first insulating film 11 and the second insulating film 12 are supported on the conductive member 15 via a sealing member 18. The sealing member 18 is, for example, an O-ring, and seals the housing space S from an external space of the sample holder 10.

In the embodiment illustrated in FIG. 1, the conductive member 15 is disposed so as to surround the electrode 13. A gap is formed between the electrode 13 and the conductive member 15, and the conductive member 15 is electrically insulated from the electrode 13. A through-hole 15h penetrating the conductive member 15 in the vertical direction is formed in a substantially central portion of the conductive member 15. The distal end portion of the electrode 13 is inserted into the through-hole 15h. An opening 15a of the through-hole 15h on the conductive film 14 side (upper side) is located between the first insulating film 11 and the electrode 13. More specifically, the opening 15a is formed at a position overlapping at least a portion of the observation window 7 when viewed from the vertical direction. That is, the opening 15a of the conductive member 15 is located between the observation window 7 and the distal end portion of the electrode 13. As described later, the conductive member 15 has a function of limiting (restricting) a region of the electric field 5 formed between the electrode 13 and the conductive film 14. The opening 15a of the conductive member 15 has a size that limits the region of the electric field 5 to the inside of the observation window 7. In other words, the conductive member 15 is interposed between electrode 13 and a non-observation region 8 to be described later around the opening 15a, and blocks the path of the AC signal from the electrode 13 toward the non-observation region 8.

The impedance microscope 1 further includes a beam irradiation unit 22, a power supply 24, a processing unit 30, and a control unit 40. The beam irradiation unit 22 is provided above the sample holder 10, and scans the conductive film 14 with a beam 6 in a two-dimensional direction along the front surface of the conductive film 14 while irradiating the conductive film 14 with the beam 6. More specifically, the beam irradiation unit 22 scans a region disposed in the observation window 7 on the front surface of the conductive film 14 with the beam 6. The observation window 7 is a region for observing the sample 2. The non-observation region 8 that does not contribute to the observation of the sample 2 is formed outside the observation window 7.

As the beam 6 emitted from the beam irradiation unit 22, for example, an electron beam, a laser, or a charged particle beam is used. Examples of the charged particle beam include an ion beam, a neutron beam, and a positron beam. In a case where an electron beam is used as the beam 6, the beam irradiation unit 22 includes, for example, an electron gun and a deflection coil. The electron gun continuously emits a converged electron beam to the conductive film 14, and a polarization coil scans the electron beam along the front surface of the conductive film 14 by changing a trajectory of the electron beam.

When the front surface of the conductive film 14 is irradiated with the beam 6, electrons are scattered at a beam irradiation position and absorbed by the first insulating film 11, so that an insulation deterioration region 20 in which the insulation is locally deteriorated is formed at a position immediately below the beam irradiation position of the first insulating film 11. That is, the impedance of the first insulating film 11 locally changes at a position immediately below the beam irradiation position.

A first terminal of the power supply 24 is electrically coupled to the electrode 13. A second terminal of the power supply 24 is grounded. The power supply 24 is, for example, a function generator that generates an AC signal (AC voltage), and applies the AC signal to the electrode 13. The AC signal applied from the power supply 24 to the electrode 13 has an arbitrary frequency of, for example, 20 Hz or more and 10 GHz or less. Note that the frequency of the AC signal is appropriately set according to a number of pixels of an image to be generated by the impedance microscope 1 and an imaging time.

When an AC signal is applied from the power supply 24 to the electrode 13, a potential difference is generated between the electrode 13 and the conductive film 14, and the electric field 5 is formed between the electrode 13 and the conductive film 14. The electric field 5 is an AC electric field whose direction periodically changes according to the frequency of the AC signal applied to the electrode 13. As illustrated in FIG. 1, when the electrode 13 has an elongated shape, the electric field 5 has a pattern that radially spreads from the distal end portion of the electrode 13 toward the conductive film 14. When the electric field 5 fluctuates between the electrode 13 and the conductive film 14, a displacement current flows between the electrode 13 and the conductive film 14. That is, the AC signal is propagated from the electrode 13 to the conductive film 14. A propagation path of the AC signal from the electrode 13 to the conductive film 14 is formed in a region where the electric field 5 is formed.

At this time, when the front surface of the conductive film 14 is irradiated with the beam 6 from the beam irradiation unit 22 and the insulation deterioration region 20 is formed in the first insulating film 11, most of the AC signal from the electrode 13 is propagated to the conductive film 14 through the insulation deterioration region 20. The remaining portion of the AC signal is propagated to the conductive film 14 through a path other than the insulation deterioration region 20.

Here, as described above, since the conductive member 15 is electrically grounded, the electric field 5 is blocked by the electrostatic shielding effect. Therefore, as illustrated in FIG. 1, the electric field 5 passes through the opening 15a located between the first insulating film 11 and the electrode 13 without passing through the conductive member 15. As a result, the spread of the electric field 5 to the non-observation region 8 that does not contribute to the observation of the sample is suppressed. As a result, the AC signal between the electrode 13 and the conductive film 14 mainly propagates through the path between the electrode 13 and the observation window 7, and is suppressed from propagating through the path between the electrode 13 and the non-observation region 8.

The control unit 40 is a computer including a processor, a storage device, an input device, a display device, a communication device, and the like, and controls the entire operation of the impedance microscope 1. The control unit 40 loads, for example, a program stored in the storage device, and executes the loaded program by the processor to implement various functions. In the control unit 40, an operator can perform command input operation and the like to manage the impedance microscope 1 using the input device, and an operating state of the impedance microscope 1 can be visualized and displayed by the display device.

More specifically, the control unit 40 is communicably coupled to the beam irradiation unit 22 and the power supply 24, and controls the operations of the beam irradiation unit 22 and the power supply 24. For example, the control unit 40 controls the beam irradiation unit 22 to control ON/OFF of the output of the beam 6 and the irradiation position. Furthermore, the control unit 40 controls the power supply 24 to control the application and stop of the application of the AC signal to the electrode 13.

As illustrated in FIG. 1, the processing unit 30 includes an AC amplifier 31, a lock-in amplifier 32, an impedance measurement unit 34a, an amplitude measurement unit 34b, a phase measurement unit 34c, and an image generation unit 35. The AC amplifier 31 detects and amplifies the AC signal propagated from the electrode 13 to the conductive film 14, and outputs the AC signal to the lock-in amplifier 32. The lock-in amplifier 32 receives the AC signal of the power supply 24 as a reference signal, extracts only a frequency component of the AC signal of the power supply 24 from a detection signal output from the AC amplifier 31, and outputs values of a real part and an imaginary part of a current signal component of the detection signal as an output signal 33. The output signal 33 output from the lock-in amplifier 32 is output to the impedance measurement unit 34a, the amplitude measurement unit 34b, and the phase measurement unit 34c. Since the impedance is an AC resistance component, the impedance can be calculated from a voltage component of the AC signal of the power supply 24 and the current signal component extracted by the lock-in amplifier 32 by using Ohm's law.

The intensity of the output signal 33 changes according to the impedance of the propagation path of the AC signal. For example, when the aqueous solution 3 is water, the aqueous solution 3 has a relatively high relative dielectric constant of about 80. Therefore, when only the aqueous solution 3 exists between the electrode 13 and the insulation deterioration region 20 in the housing space S, the impedance between the electrode 13 and the insulation deterioration region 20 decreases, and the attenuation of the AC signal decreases. Therefore, the amplitude of the output signal 33 output from the lock-in amplifier 32 increases.

On the other hand, for example, when the sample 2 is a biological sample composed of an amino acid, a lipid, or the like, the sample has a relative dielectric constant as low as about 2 to 5. Therefore, as illustrated in FIG. 1, when the sample 2 exists between the electrode 13 and the insulation deterioration region 20 in the housing space S, the impedance between the electrode 13 and the insulation deterioration region 20 increases, and the attenuation of the AC signal increases. Therefore, the amplitude of the output signal 33 output from the lock-in amplifier 32 decreases.

Using such a relationship, the impedance measurement unit 34a calculates impedance information based on the output signal 33. In addition, the amplitude measurement unit 34b and the phase measurement unit 34c acquire amplitude information and phase information based on the output signal. A method for calculating the impedance information, the amplitude information, and the phase information from the output signal 33 is known as described in, for example, Non Patent Literature 2. The calculated impedance information, the amplitude information, and the phase information are output to the image generation unit 35.

The image generation unit 35 generates an image of the sample 2 (impedance image, amplitude image, and phase image) based on the impedance information, the amplitude information, and the phase information corresponding to the irradiation position of the beam 6. As described above, the beam 6 is scanned two-dimensionally within a designated range of the observation window 7. The image generation unit 35 forms an image of the sample 2 by plotting the amplitude and a phase value of the impedance according to the irradiation position of the beam at each position (pixel) on the two-dimensional image corresponding to the irradiation position of the beam 6. Note that the impedance measurement unit 34a may individually measure a resistance, an inductance, and a conductance as the impedance information, and the image generation unit 35 may individually generate images regarding the resistance, the inductance, and the conductance. Since the impedance information, the amplitude information, and the phase information change depending on the compositions of the sample 2 and the aqueous solution 3 existing on the propagation path of the AC signal, the image generated based on the impedance information, the amplitude information, and the phase information includes not only a shape of the sample 2 but also information on the composition of the sample 2. Therefore, the image generated by the image generation unit 35 can be used for composition analysis of the sample 2.

As described above, the intensity of the output signal 33 changes according to the impedance of the substance existing between the electrode 13 and the insulation deterioration region 20. For example, when the sample 2 exists between the electrode 13 and the insulation deterioration region 20, the impedance value increases, and when the sample 2 does not exist between the electrode 13 and the insulation deterioration region 20, the impedance value decreases. Based on such a change in the impedance value, the impedance microscope 1 can form an image corresponding to the irradiation position of the beam 6 and observe the sample 2 as an image.

Figure 2:
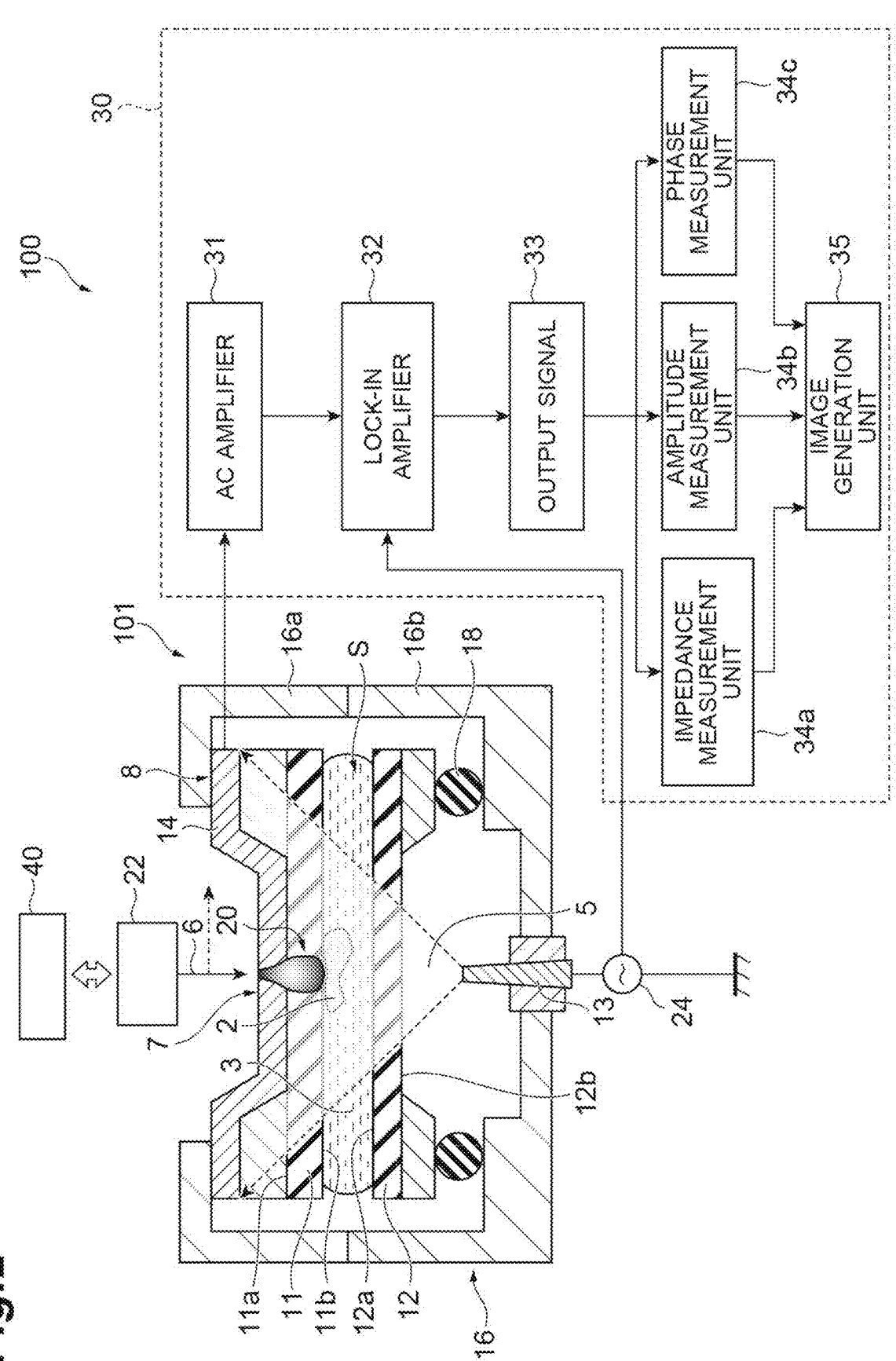
FIG. 2 is a cross-sectional view schematically illustrating a conventional impedance microscope.

FIG. 2 is a cross-sectional view schematically illustrating an impedance microscope 100 including a conventional sample holder 101. As illustrated in FIG. 2, since the electric field 5 formed between the electrode 13 and the conductive film 14 has a pattern that radially spreads from the distal end portion of the electrode 13 toward the conductive film 14, in the impedance microscope 100, the electric field 5 spreads over the entire sample holder 10, and a path of an AC signal is formed not only between the electrode 13 and the observation window 7 but also between the electrode 13 and the non-observation region 8. The AC signal propagated to the conductive film 14 through the path between the electrode 13 and the non-observation region 8 is a noise or an offset component that does not contribute to the observation of the sample 2, and relatively reduces the intensity of the signal component propagated through the path between the electrode 13 and the observation window 7. The noise or offset component causes a decrease in the contrast or the resolution of the image generated by the image generation unit 35.

On the other hand, the sample holder 10 according to the above embodiment includes a conductive member 15 having an opening 15a. Since the conductive member 15 is coupled to the ground potential, the electric field 5 is blocked by the electrostatic shielding effect. Therefore, the electric field 5 formed between the electrode 13 and the conductive film 14 can pass through only the portion where the opening 15a is formed, and the region where the electric field 5 is formed is limited. Since the opening 15a of the conductive member 15 is formed between the first insulating film 11 and the electrode 13, in the sample holder 10, the spread of the electric field 5 to the non-observation region 8 that does not contribute to the observation of the sample 2 is suppressed, and the region where the electric field 5 is formed is limited to the vicinity of the observation window 7. With such a configuration, an SN ratio of the signal detected by the conductive film 14 can be improved, and as a result, a high-contrast image can be obtained in the impedance microscope 1. Therefore, the spatial resolution of the impedance microscope 1 can be enhanced.

Second Embodiment

Figure 3:
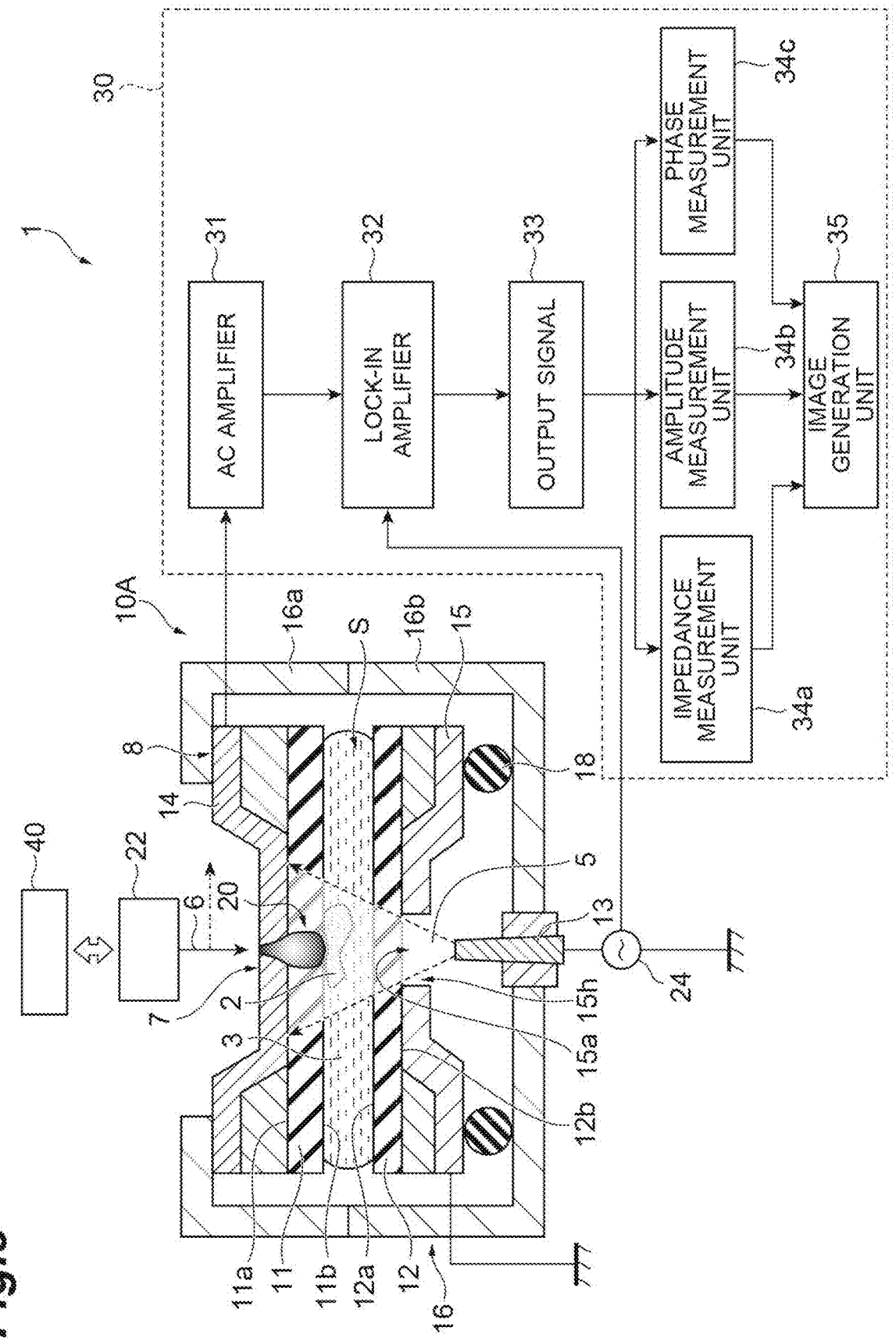
FIG. 3 is a cross-sectional view schematically illustrating an impedance microscope including a sample holder according to a second embodiment.

Next, a sample holder according to a second embodiment will be described with reference to FIG. 3. FIG. 3 is a cross-sectional view schematically illustrating an impedance microscope 1 including a sample holder 10A according to the second embodiment. The sample holder 10A is different from the sample holder 10 illustrated in FIG. 1 in that the conductive member 15 is disposed on the back surface 12b side of the second insulating film 12. Hereinafter, differences from the sample holder 10 according to the first embodiment will be mainly described, and redundant description will be omitted.

As illustrated in FIG. 3, the conductive member 15 of the sample holder 10A is in contact with the back surface 12b of the second insulating film 12. The conductive member 15 is supported on the sealing member 18 together with the first insulating film 11 and the second insulating film 12. The conductive member 15 is electrically grounded and fixed at a ground potential. The conductive member 15 is separated from the electrode 13 via a gap, and is electrically insulated from the electrode 13. A through-hole 15h penetrating the conductive member 15 in the vertical direction is formed in a substantially central portion of the conductive member 15. The opening 15a on the upper side of the through-hole 15h is located between the first insulating film 11 and the electrode 13.

In the sample holder 10A, the electrostatic shielding effect of the conductive member 15 suppresses the spread of the electric field to the non-observation region 8 that does not contribute to the observation of the sample 2, and the position where the electric field 5 is formed between the conductive film 14 and the electrode 13 is limited to the region between the electrode 13 and the observation window 7. Therefore, the noise component included in the signal detected in the conductive film 14 can be reduced, and a high-contrast image can be obtained.

Third Embodiment

Figure 4:
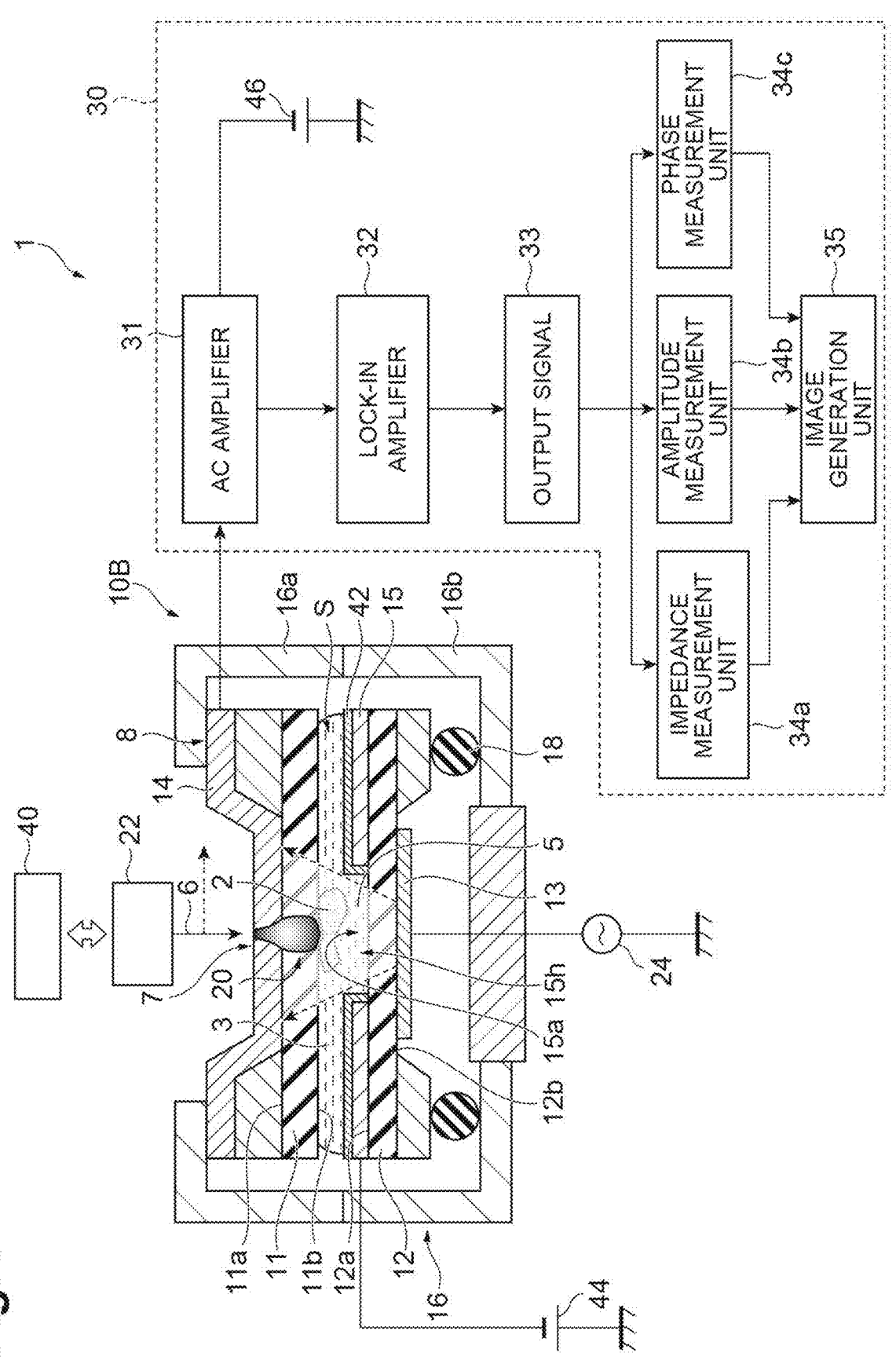
FIG. 4 is a cross-sectional view schematically illustrating an impedance microscope including a sample holder according to a third embodiment.

Next, a sample holder according to a third embodiment will be described. FIG. 4 is a cross-sectional view schematically illustrating an impedance microscope 1 including a sample holder 10B according to the third embodiment. Hereinafter, differences from the sample holder 10 according to the first embodiment will be mainly described, and redundant description will be omitted.

As illustrated in FIG. 4, the sample holder 10B includes a plate-shaped electrode 13. The electrode 13 is in contact with the back surface 12b of the second insulating film 12, and faces the back surface 11b of the first insulating film 11 via the second insulating film 12. The electrode 13 receives an AC signal from the power supply 24 and forms an electric field 5 between the conductive film 14 and the electrode 13.

In the sample holder 10B, the conductive member 15 is disposed on the front surface 12a of the second insulating film 12. That is, the conductive member 15 is disposed between the first insulating film 11 and the second insulating film 12. In order to ensure insulation between the aqueous solution 3 and the conductive member 15, an insulating coat layer 42 made of an insulating material is formed on the front surface of the conductive member 15. The conductive member 15 is coupled to a DC power supply 44. Thus, the conductive member 15 is fixed at a constant potential.

A through-hole 15h penetrating the conductive member 15 in the vertical direction is formed in a substantially central portion of the conductive member 15. The opening 15a on the upper side of the through-hole 15h is located between the first insulating film 11 and the electrode 13. Since the conductive member 15 fixed at a constant potential blocks the electric field by the electrostatic shielding effect, the region where the electric field 5 is formed between the electrode 13 and the conductive film 14 is limited to the region where the opening 15a is formed.

The conductive film 14 of the sample holder 10B is coupled to a DC power supply 46 via the AC amplifier 31. The DC power supply 46 applies a bias voltage to the conductive film 14 to improve the sensitivity of the output signal 33 detected by the lock-in amplifier 32.

As described above, the sample holder 10B limits the region where the electric field 5 is formed to the vicinity of the observation window 7 by suppressing the spread of the electric field 5 to the non-observation region 8 that does not contribute to the observation of the sample 2 by the electrostatic shielding effect of the conductive member 15. In particular, in the sample holder 10B, since the conductive member 15 is disposed close to the first insulating film 11, the range of the electric field 5 can be accurately controlled such that the electric field 5 is radiated only to the observation window 7. By using the sample holder 10B, a noise component of the output signal 33 can be reduced, and a high-contrast image can be obtained.

Fourth Embodiment

Figure 5:
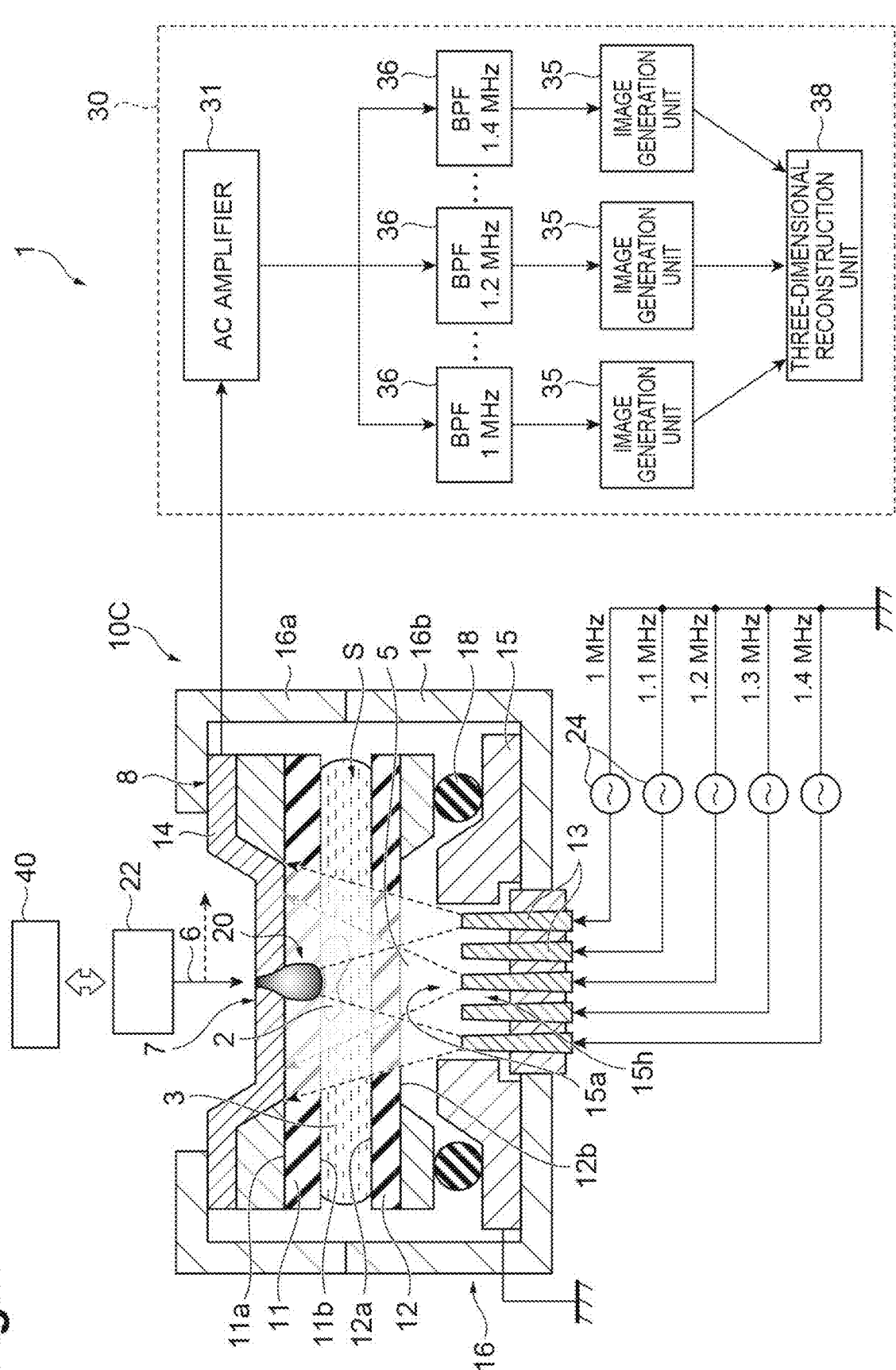
FIG. 5 is a cross-sectional view schematically illustrating an impedance microscope including a sample holder according to a fourth embodiment.

Next, a sample holder according to a fourth embodiment will be described. FIG. 5 is a cross-sectional view schematically illustrating an impedance microscope 1 including a sample holder 10C according to the fourth embodiment. Hereinafter, differences from the sample holder 10 according to the first embodiment will be mainly described, and redundant description will be omitted.

As illustrated in FIG. 5, the sample holder 10C includes a plurality of electrodes 13. The plurality of electrodes 13 are disposed below the second insulating film 12, and the distal end portion of each electrode 13 is disposed to face the back surface 12b of the second insulating film 12. The plurality of electrodes 13 may be arranged one-dimensionally or two-dimensionally below the second insulating film 12. The conductive member 15 is disposed so as to surround the periphery of the plurality of electrodes 13, and the opening 15a of the conductive member 15 is located between the first insulating film 11 and the plurality of electrodes 13.

The plurality of electrodes 13 are coupled to the plurality of power supplies 24, respectively. As illustrated in FIG. 1, the plurality of power supplies 24 apply AC signals having different frequencies to the plurality of electrodes 13. When the AC signals are applied to the plurality of electrodes 13, the electric fields 5 are formed between the electrode 13 and the conductive film 14 in the sample holder 10C. At this time, the region where the electric field 5 is formed is limited to the region where the opening 15a is formed by the conductive member 15. With the formation of the electric fields 5, the AC signals are propagated from the plurality of electrodes 13 to the conductive film 14. The AC signals propagated to the conductive film 14 include a plurality of frequency components applied by the plurality of power supplies 24.

The processing unit 30 includes an AC amplifier 31, a plurality of image generation units 35, a plurality of band pass filters 36, and a three-dimensional reconstruction unit 38. The AC amplifier 31 amplifies the AC signal propagated to the conductive film 14 and outputs the amplified AC signal to the plurality of band pass filters 36. The plurality of band pass filters 36 separate the signal output from the AC amplifier 31 into a plurality of frequency components. The image generation unit 35 acquires impedance information of each frequency component and generates an image of the sample 2 for each frequency component.

Each of the plurality of images generated by the plurality of image generation units 35 is an inclination image corresponding to an angle connecting each position of the plurality of electrodes 13 and the position of the insulation deterioration region 20. In the sample holder 10C, by applying AC signals having different frequencies to the plurality of electrodes 13, a plurality of inclination images can be generated by one scan of the beam 6. The plurality of inclination images thus generated are output to the three-dimensional reconstruction unit 38. The three-dimensional reconstruction unit 38 reconstructs a three-dimensional image of the sample 2 by combining the plurality of inclination images.

Similarly to the sample holder 10, the sample holder 10C according to the fourth embodiment can reduce a noise component of an output signal and obtain a high-contrast image. Furthermore, in the sample holder 10C, a plurality of inclination images can be generated by one scan of the beam 6 by applying AC signals having different frequencies to the plurality of electrodes 13. Therefore, the three-dimensional structure analysis of the sample 2 can be performed in a short time.

Hereinafter, an experimental example of an impedance microscope will be described with reference to FIGS. 6 and 7, but the present invention is not limited to the following experimental example.

In the experimental example, the sample 2 was observed by using the impedance microscope 1 illustrated in FIG. 1. As the sample 2, beads having a diameter of 1 μm disposed on the back surface 11b side of the first insulating film 11 together with the aqueous solution 3 were used. Water was used as the aqueous solution 3. As the first insulating film, a 50 nm-thick SiN thin film in which a 10 nm-thick tungsten conductive film 14 was formed on the front surface 11*a* was used. The size of the observation window 7 was 0.4 mm×0.4 mm. A sine wave signal of 500 kHz was applied to the electrode 13. The conductive member 15 having an opening 15*a* having a diameter of 1 mm was disposed on a bottom portion of the outer frame body 16. FIG. 6(*a*) is an amplitude image acquired in the experimental example, and FIG. 6(*b*) is a phase image acquired in the experimental example.

On the other hand, in a comparative experimental example, the sample 2 was observed using the conventional impedance microscope 100 illustrated in FIG. 2. FIG. 7(*a*) is an amplitude image acquired in the comparative experimental example, and FIG. 7(*b*) is a phase image acquired in the comparative experimental example. The comparative experimental example is different from the experimental example in that the conductive member 15 is not provided. Other experimental conditions of the comparative experimental example were the same as those of the experimental example.

Figure 6:
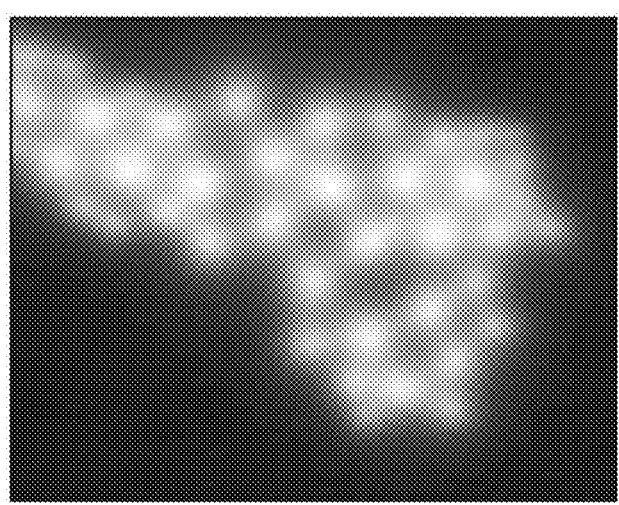
FIG. 6(a) is an amplitude image acquired in an experimental example.
FIG. 6(b) is a phase image acquired in the experimental example.
Figure 6:
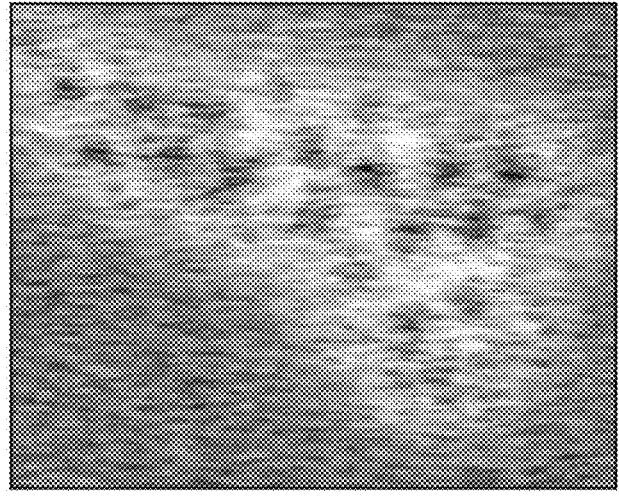
Figure 7:
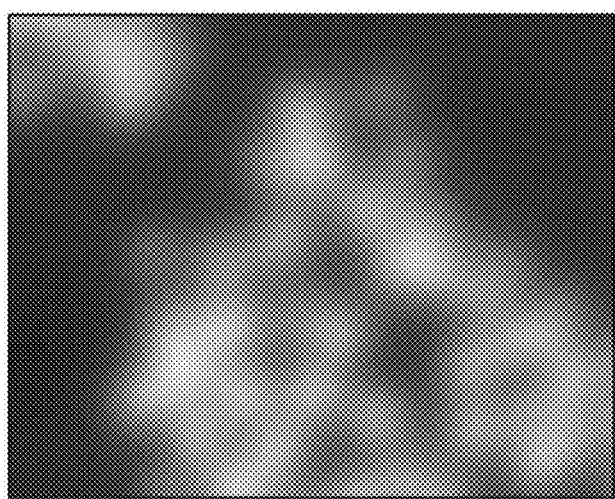
FIG. 7(a) is an amplitude image acquired in a comparative experimental example.
FIG. 7(b) is a phase image acquired in the comparative experimental example.
Figure 7:

As illustrated in FIGS. 6(*a*) and 6(*b*), the amplitude image and the phase image acquired in the experimental example have less noise and clearly show the sample. On the other hand, in the amplitude image and the phase image illustrated in FIGS. 7(*a*) and 7(*b*), there are many noises, and the image of the sample is blurred and unclear as a whole. From these results, it was confirmed that the impedance microscope 1 can observe a sample with higher spatial resolution than the conventional impedance microscope 100. This result is considered to be due to the fact that the noise component included in the detection signal can be reduced by limiting the region where the electric field 5 is formed to the vicinity of the observation window 7 by the conductive member 15.

Although the sample holder and the impedance microscope according to various embodiments have been described above, various modifications can be made without being limited to the above-described embodiments without changing the gist of the invention.

For example, in the above-described embodiment, the AC amplifier 31 is coupled to the conductive film 14 and detects the AC signal propagated from the electrode 13 to the conductive film 14, but the AC amplifier 31 may be coupled to the electrode 13 and detect the AC signal at the electrode 13. Also in this case, a high-contrast image can be generated from the detected AC signal.

In addition, the sample 2 does not need to be disposed in the aqueous solution 3, and may be disposed in a substance having a dielectric constant different from that of the sample 2 or in vacuum. Even in this case, an image of the sample 2 can be generated from the difference in the dielectric constant. Note that the various embodiments described above can be combined without inconsistency.

REFERENCE SIGNS LIST

1 Impedance microscope
2 Sample
6 Beam
10, 10A, 10B, 10C, 101 Sample holder
11 First insulating film
11*a* Front surface
11*b* Back surface
12*a* Front surface
12*b* Back surface
12 Second insulating film

13 Electrode
14 Conductive film
15 Conductive member
15*a* Opening
22 Beam irradiation unit
24 Power supply
35 Image generation unit

The invention claimed is:

1. A sample holder for an impedance microscope, the sample holder comprising:
   a first insulating film having a front surface and a back surface;
   a second insulating film having a front surface facing the back surface of the first insulating film and a back surface;
   a conductive film disposed on the front surface of the first insulating film;
   an electrode disposed to face the back surface of the second insulating film; and
   a conductive member fixed at a ground potential or a constant potential,
   wherein the conductive member has an opening located between the first insulating film and the electrode.

2. The sample holder according to claim 1, wherein the conductive member is disposed so as to surround the electrode.

3. The sample holder according to claim 1, wherein the conductive member is disposed on the back surface of the second insulating film.

4. The sample holder according to claim 1, wherein the conductive member is disposed between the first insulating film and the second insulating film.

5. The sample holder according to claim 1, further comprising:
   a frame member disposed on the front surface of the first insulating film to define an observation window for observing a sample inside the frame member,
   wherein when an AC signal is applied to the electrode to form an electric field between the electrode and the conductive film, the conductive member suppresses spread of the electric field to outside of the observation window by an electrostatic shielding effect.

6. The sample holder according to claim 5, wherein
   the electrode has an elongated shape extending toward the second insulating film, and
   the opening of the conductive member is located between the observation window and a distal end portion of the electrode on the second insulating film side.

7. An impedance microscope comprising:
   a first insulating film having a front surface and a back surface;
   a second insulating film having a front surface facing the back surface of the first insulating film and a back surface, the second insulating film forming a space in which a sample is disposed between the first insulating film and the second insulating film;
   a conductive film disposed on the front surface of the first insulating film;
   an electrode disposed to face the back surface of the second insulating film;
   a conductive member fixed at a ground potential or a constant potential;
   a beam irradiation unit configured to scan the conductive film while irradiating the conductive film with a beam;
   a power supply configured to apply an AC signal to the electrode; and an image generation unit configured to generate an image of the sample based on the AC signal guided to the conductive film when the AC signal is applied to the electrode while scanning the conductive film with the beam, wherein the conductive member has an opening located between the first insulating film and the electrode.

8. The impedance microscope according to claim 7, further comprising:

a frame member disposed on the front surface of the first insulating film to define an observation window for observing the sample inside the frame member, wherein when an AC signal is applied to the electrode to form an electric field between the electrode and the conductive film, the conductive member suppresses spread of the electric field to outside of the observation window by an electrostatic shielding effect.

9. The impedance microscope according to claim 8, wherein the electrode has an elongated shape extending toward the second insulating film, and the opening of the conductive member is located between the observation window and a distal end portion of the electrode on the second insulating film side.

10. A sample holder for an impedance microscope, the sample holder comprising:

an electrode coupled to a power supply;

a first insulating film having a front surface and a back surface;

a frame member disposed on the front surface of the first insulating film to define an observation window for observing a sample inside the frame member;

a conductive film in contact with the front surface of the first insulating film inside the frame member;

a second insulating film disposed between the electrode and the back surface of the first insulating film, the second insulating film forming a housing space in which the sample is disposed between the first insulating film and the second insulating film; and a conductive member configured to suppress spread of an electric field to outside of the observation window by an electrostatic shielding effect when an AC signal is applied from the power supply to the electrode to form the electric field between the electrode and the conductive film.

11. The sample holder according to claim 10, wherein the electrode has an elongated shape extending toward the second insulating film, and the conductive member has an opening located between the observation window and a distal end portion of the electrode on the second insulating film side.

* * * * *